United States Patent [19]

Kupfer

[11] 4,369,417

[45] Jan. 18, 1983

[54] CIRCUIT FOR TUNABLE RADIO-FREQUENCY CIRCUITS

[75] Inventor: Karl-Heinz Kupfer, Krefeld, Fed. Rep. of Germany

[73] Assignee: U.S. Philips Corporation, New York, N.Y.

[21] Appl. No.: 205,078

[22] Filed: Nov. 10, 1980

[30] Foreign Application Priority Data

Nov. 10, 1979 [DE] Fed. Rep. of Germany ....... 2945546

[51] Int. Cl.³ ............................. H03J 7/24; H03J 3/04
[52] U.S. Cl. .................................. 334/15; 307/310; 331/176
[58] Field of Search .................. 331/178; 307/310; 334/15

[56] References Cited

U.S. PATENT DOCUMENTS

| | | | |
|---|---|---|---|
| 2,811,647 | 10/1957 | Nilssen | 331/176 |
| 3,428,916 | 2/1969 | Hovenga et al. | 331/176 |
| 3,777,289 | 12/1973 | Makino | 334/15 |
| 4,015,218 | 3/1977 | Sanderson | 331/176 |
| 4,195,274 | 3/1980 | Suganuma | 307/310 |

*Primary Examiner*—John S. Heyman
*Attorney, Agent, or Firm*—Thomas A. Briody; William J. Streeter; Edward W. Goodman

[57] ABSTRACT

A circuit is provided for frequency drift compensation of a tuning diode in tunable RF-circuits, and comprises a temperature-responsive voltage divider coupled between an independent voltage supply source and a reference potential, the tuning diode being coupled to a tap of the voltage divider. In this circuit the separate tuning voltage source is not loaded down and may thus produce a tuning voltage which is independent of the variation of the voltage from the temperature compensation portion of the circuit.

3 Claims, 3 Drawing Figures

CIRCUIT FOR TUNABLE RADIO-FREQUENCY CIRCUITS

BACKGROUND OF THE INVENTION

The invention relates to a circuit for tunable RF-circuits, for example for tuning an oscillator, comprising to compensate for temperature-responsive variations in the frequency owing to the temperature coefficients of the components, a temperature-responsive voltage divider having a tap which is connected to a tuning voltage source via a tuning diode.

Such a circuit arrangement is disclosed in German published Patent Application No. 1,614,794.

In the known circuit a tuning voltage, which is supplied by the tuning voltage source via a controllable tuning voltage divider, is applied to the cathode of the tuning diode. The voltage across the tuning diode is compensated for temperature variations by means of a compensation diode, which is connected between the tuning diode anode and ground. In conjunction with a series-arranged series resistor, the compensation diode forms a temperature-responsive voltage divider which is supplied, in the prior art circuit, from the tuning voltage source.

However, partly because of the severe requirements imposed on the stability and on the rangewidth of the tuning voltage, the output power of the tuning voltage source is very limited. This particularly applies when the tuning voltage source has been realized in the form of an integrated circuit. The energy which the temperature-responsive voltage divider takes from the tuning voltage source must therefore be kept low, which in practice results in that the current through the compensation diode is too limited to effect a temperature-responsive voltage variation with the compensation diode which compensates to a sufficient degree for the temperature-responsive voltage variation across the tuning diode.

SUMMARY OF THE INVENTION

The invention has for its object to obviate these drawbacks in a circuit of the type described in the preamble.

According to the invention, such a circuit is characterized in that the temperature-responsive voltage divider is connected between voltage supply source and a reference potential and that the tuning voltage source produces a tuning voltage which is independent of the variations of the voltage from the voltage supply source.

When the measure of the invention is used, the temperature-responsive voltage divider is supplied from the voltage supply source, which is independent of the tuning voltage source. As a consequence thereof, larger currents are available for setting the temperature response of the voltage at the tapping point of the temperature-responsive voltage divider and a proper temperature compensation can be accomplished. While the supply voltage may be much smaller than the maximum tuning voltage, the output current of the voltage supply source may be much higher than the output current of the tuning voltage source, so that the setting range of the temperature-responsive voltage divider may be much wider.

A preferred embodiment of a circuit according to the invention is characterized in that the temperature-responsive divider comprises a series arrangement of a negative temperature coefficient (NTC) resistor and a series resistor, the tuning diode being connected to the reference potential via the NTC resistor.

As is known, the magnitude of the temperature-responsive variation across the tuning diode varies with the tuning voltage. When the last-mentioned measure of the invention is used, an accurate temperature compensation in a predetermined desired range within the tuning range is possible by a proper choice of the temperature coefficient of the NTC resistor.

A further preferred embodiment of such a circuit of the invention is characterized in that the voltage divider comprises a series-arranged variable resistor between the NTC resistor and the operating voltage source, the value of which varies with the tuning voltage.

When this measure is used an accurate temperature compensation over the full range of the tuning voltage can be realized.

A still further preferred embodiment of the circuit of the invention is characterized in that the variable resistor comprises a transistor the control electrode of which is connected to the tuning voltage source and the input-output path is arranged in series with the NTC resistor.

DESCRIPTION OF THE DRAWINGS

Embodiments of the invention will now be further explained by way of non-limitative examples with reference to the drawing in which.

DESCRIPTION OF THE PREFERRED EMBODIMENT

Figures 1, 2:
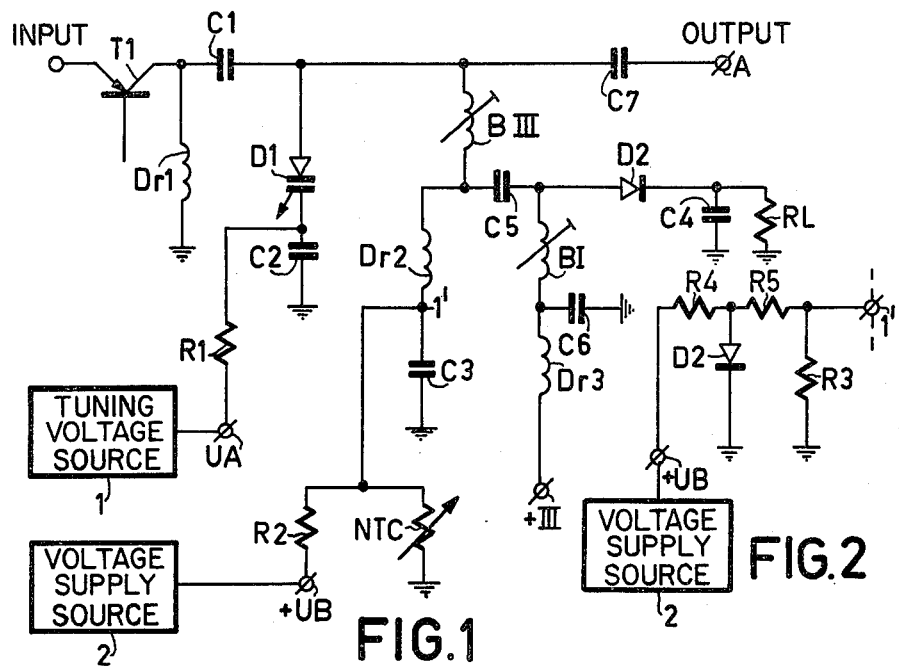
FIG. 1 shows a circuit diagram of the circuit according to the invention for tuning an oscillator.
FIG. 2 shows the substitution of a semi-conductor diode for the NTC resistor.

In the circuit shown in FIG. 1, T1 is an oscillator transistor. An input signal is applied to the emitter of transistor T1 while the collector of transistor T1 is coupled to a tunable RF resonant circuit via a coupling capacitor C1 and to a reference potential or ground via a choke Dr1.

The tunable RF resonant circuit comprises a tuning diode $D_1$ the cathode of which is connected for radio frequency to ground via a capacitor C2 and to which a stabilised tuning voltage UA is applied from a stabilised tuning voltage source 1 via a series resistor R1.

The anode of the tuning diode D1 is connected to the collector of the oscillator transistor T1 via the coupling capacitor C1 and is also connected to a tapping point of a temperature-responsive voltage divider R2, NTC via a coil BIII and a choke Dr2, which is connected to ground for radio frequency via a capacitor C3. The temperature responsive voltage divider R2, negative temperature coefficient (NTC) comprises a NTC-resistor NTC which is arranged between the tapping point and ground and a series resistor R2 arranged in series with this NTC-resistor. The series resistor R2 is supplied with a supply voltage UB from a voltage supply source 2.

The coil BIII is connected to ground via a coupling capacitor C5, a switching diode D2 and a mass capacitor C4. A switching voltage can be applied to the switching diode D2 via a series arrangement of a choke DR3 and a coil BI. The diode current through the switching diode D2 is passed to ground via a resistor RL. The resistor RL determines the magnitude of this diode current. The coil BI is further connected for radio frequency to ground via a capacitor C6. The output signal may be taken off at terminal A via a coupling choke C7.

As shown in FIG. 1, the coil BI is the coil for tuning the television band I (47–68 MHz) and the choke Dr3 is used to block the RF voltage relative to terminal +III.

By applying a switching voltage to a terminal +III, the BIII coil being connected to ground for radio frequency by the switching diode D2 via the capacitor C4, the RF resonant circuit can be tuned to a predetermined tuning frequency in the so-called BIII frequency range (174–230 MHz) by changing the tuning voltage at the terminal UA. This tuning voltage reaches the tuning diode D1 via the series resistor R1, which has for example, a value of 39 kOhm. The direct current then flows from the tuning diode D1 to the said coil BIII for the band III-range. Thereafter, after having passed through BIII the diode current flows through the choke Dr2 and to ground via the NTC-resistor NTC.

According to the manufacturer's specification, the diode current amounts in the operating condition of the tuning diode to some nA. The tuning voltage source 1 is therefore practically not loaded. As the NTC resistor has a value of approximately 1 kOhm, the voltage across the NTC resistor in response to the said diode current is so small that it may be neglected. by supplying the NTC resistor via the resistor R2 from the voltage supply source 2, which can produce comparatively large currents, the anode voltage D1 can be adjusted to any optional value.

When a tuning diode D1 of, for example, the type BB209 is used, the voltage across the NTC-resistor must be approximately 50 mV.

As is known, the capacitance of the tuning diode D1 varies with both the temperature and the diode reverse bias voltage. In the construction shown a temperature responsive capacitance variation of the tuning diode D1 is compensated by an equally large but oppositely directed capacitance variation in response to a variation of the diode reverse bias voltage across the tuning diode D1. This diode reverse bias voltage variation is equally large as and opposite to the temperature-responsive voltage variation across the NTC resistor. With a proper choice of the NTC resistor, its temperature coefficient having been accurately matched to that of the diode capacitance, a proper temperature compensation can thus be realised without fail in a predetermined desired range within the tuning range.

FIG. 2 shows an alternative embodiment with a germanium diode D2 which is connected between series-arranged resistors R4 and R5 and ground, the resistors R4, R5 and a resistor R3 arranged in series therewith forming together a voltage divider. The resistor R4 may have, for example, a value of 68 kOhm, the resistor R5 a value of 18 kOhm and the resistor R10 a value of 10 kOhm.

The diode of FIG. 2 may for example, be of the type AAZ18 or OA91. A voltage of approximately 0.160 V is applied to this diode.

Figure 3:
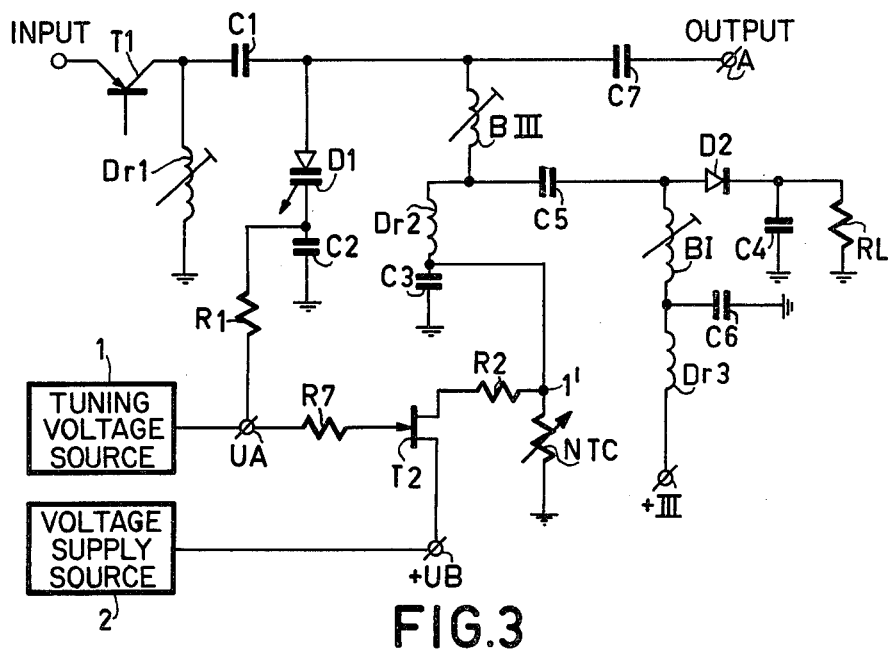
FIG. 3 shows a circuit according to the invention in which a field-effect transistor is used.

FIG. 3 shows an embodiment of a circuit of the invention in which elements corresponding to the elements of the circuits of FIGS. 1 and 2 having been given the same reference numerals. This circuit comprises a field-effect transistor T2 which functions as a variable resistor and the gate electrode of which is connected to the tuning voltage source 1 via a resistor R7 and the input-output or source-drain path of which is arranged in series between the series-resistor R2 and the voltage supply source 2.

As the tuning diode D1 has a large capacitive change at a low tuning voltage and a small capacitance change per Volt at a high tuning voltage corresponding to the upper frequency band, it may be desirable for a temperature compensation of the entire tuning range, particularly at higher tuning frequencies, to have the voltage at the tapping point of the temperature-responsive voltage divider T2, R2, NTC follow the tuning voltage UA. In the construction shown this is accomplished by means of the field-effect transistor T2 (of, for example, the type BF 245A), which loads the tuning voltage source 1 only in the nA-range and the compensation current through the NTC resistor changes proportionally with the tuning voltage, such that in the lower tuning range a drop of approximately 10 mV is obtained across the NTC and in the upper tuning range a drop of approximately 100 mV. This results in a tracking drift compensation over the entire tuning range.

The components shown in the circuit of FIG. 1 may have the following values:
C1=8.2 pF
C7=1.5 pF
C2=68 pF,
R1=39 kOhm,
Dr2=500 nH
Dr3=500 nH.
C5=1 nF,
C6=100 pF.

The supply voltage +UB may be +12 V. In principle any direct voltage may be chosen. A voltage of approximately 50 mV must be applied at the tapping point 1 of the temperature-responsive voltage divider R2, NTC. This voltage across point 1 is set in dependence on the supply voltage UB by means of the NTC and the resistor R2. The division ratio of the resistor NTC with respect to the resistor R2 determines the drift compensation. The tuning voltage source 1 may be implemented by means of the integrated circuit TCA 750. The operating voltage source 2 may be realised in known manner by means of a transformer for converting the mains voltage to a low alternating voltage of, for example, 12 V and a rectifier circuit for converting this low alternating voltage into supply direct voltage.

The components shown in the circuit of FIG. 3 may have the following values:
C1=1.5 pF
C5=as in FIG.=1 nF
C2=68 pF,
C6=150 pF,
R7=22 MOhm (depending on the rating 1 MOhm to 22 MOhm),
R2=180 kOhm The NTC has a value of 1 kOhm, as in FIG. 1. The diode D2 may be, for example, of the type BA482. The same type may also be used in the circuit of FIG. 1. Each choke Dr2 and Dr3 has a value of 500 nH, as in FIG. 1.

The choke Dr1 has a value of 2.6 nH. This value also holds for the choke of FIG. 1.

In the circuit of FIG. 3 the voltage +UB is +30 V and the voltage UA varies in dependence on the tuning between 1 V and 28 V, which also applies to FIG. 1.

The capacitor C4 may be a value of 1 nF and the value of resistor RL may be 4.7 kOhm.

What is claimed is:

1. A circuit for compensating for temperature-responsive variations of the circuit frequency of tunable RF-circuits having an oscillator, a tuning voltage source and a tuning diode coupled between said oscillator and said tuning voltage source, characterized in that said circuit comprises a separate voltage supply source, variable resistance means having a control input, and a temperature-responsive voltage divider, wherein said variable resistance means and said temperature-responsive voltage divider are coupled in series between said voltage supply source and a reference potential, said control input of said variable resistance means being coupled directly to said tuning voltage source while a tap of said temperature-responsive voltage divider being coupled to said tuning voltage source through said tuning diode, whereby the tuning voltage from said tuning voltage source is independent of variations in the compensating circuit and furthermore the value of said variable resistance means varies in dependence on the tuning voltage.

2. A circuit as claimed in claim 1, characterized in that the temperature-responsive voltage divider comprises a series arrangement of a negative temperature coefficient (NTC) resistor and a series resistor, the tuning diode being coupled to the reference potential through the NTC resistor.

3. A circuit as claimed in claim 2, characterized in that the variable resistance means comprises a field effect transistor, the control electrode of which is connected to the tuning voltage source and the input-output path is arranged in series with the NTC resistor and the series resistor.

* * * * *